(12) United States Patent  
Williams

(10) Patent No.: US 6,353,271 B1  
(45) Date of Patent: Mar. 5, 2002

(54) EXTREME-UV SCANNING WAFER AND RETICLE STAGES

(75) Inventor: Mark E. Williams, Windham, NH (US)

(73) Assignee: EUV, LLC, Santa Clara, CA (US)

( * ) Notice: Subject to any disclaimer, the term of this patent is extended or adjusted under 35 U.S.C. 154(b) by 0 days.

(21) Appl. No.: 09/430,858

(22) Filed: Oct. 29, 1999

(51) Int. Cl.$^7$ ............................................. H02K 41/00
(52) U.S. Cl. ........................................................ 310/12
(58) Field of Search ............................. 310/12, 51, 13, 310/14, 15, 17, 20, 23, 27, 152, 156, 91; 33/1 M

(56) References Cited

U.S. PATENT DOCUMENTS

| | | | |
|---|---|---|---|
| 4,891,526 A | | 1/1990 | Reeds .................... 250/442.1 |
| 5,127,337 A | * | 7/1992 | Beattie et al. ............... 104/294 |
| 5,157,296 A | | 10/1992 | Trumper ................... 310/90.5 |
| 5,196,745 A | | 3/1993 | Trumper ...................... 310/12 |
| 5,294,854 A | | 3/1994 | Trumper ................... 310/90.5 |
| 5,521,448 A | * | 5/1996 | Tecza et al. ............... 310/90.5 |
| 5,623,853 A | | 4/1997 | Novak et al. ............. 74/490.09 |
| 5,699,621 A | | 12/1997 | Trumper et al. ............. 33/1 M |
| 5,925,956 A | * | 7/1999 | Ohzeki ..................... 310/90.5 |

OTHER PUBLICATIONS

Trumper, D.L., "Magnetic Suspension Techniques for Precision Motion Control", MIT Doctoral Thesis, Sep. 1990.
Williams, M.E., "Precision Six Degree of Freedom Magnetically–Levitated Photolithography Stage", MIT Doctoral Thesis, Oct. 1997.

* cited by examiner

Primary Examiner—Nestor Ramirez
Assistant Examiner—Guillermo Perez
(74) Attorney, Agent, or Firm—Burns, Doane, Swecker & Mathis, L.L.P.

(57) ABSTRACT

A stage for precise positioning of a chuck in three orthogonal linear axes and in three orthogonal rotation axes that includes first and second subassemblies. The a first subassembly includes (i) a monolithic mirror that supports the chuck wherein the monolithic mirror has at least two polished orthogonal faces for interferometric determination of the X, Y, and $\Theta z$ positions; (ii) a plurality of electromagnetic actuators that control fine positioning in all six axes and coarse positioning in one axis; (iii) a position sensor for measuring the vertical Z position of the monolithic mirror; and (iv) a Lorentz actuator, that includes magnet array, for effecting motion in the Y axis. The a second subassembly comprising a stepping axis beam over which the first subassembly is suspended, wherein the stepping axis beam includes a drive coil array for the Lorentz actuator. T the stage can also include a cable stage subassembly that is positioned a fixed distance away from the monolithic mirror and/or a mechanical zero reference for the first subassembly.

16 Claims, 6 Drawing Sheets

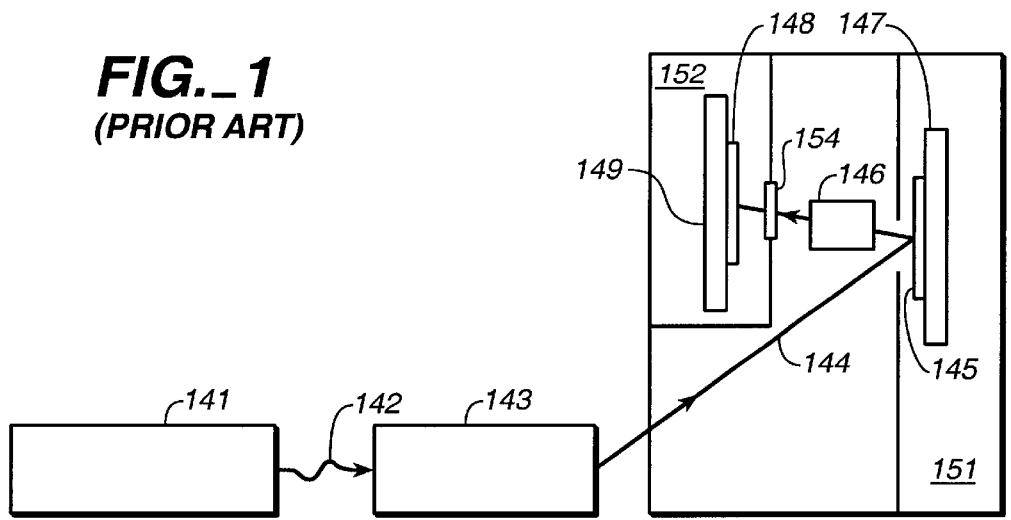
FIG._1
(PRIOR ART)
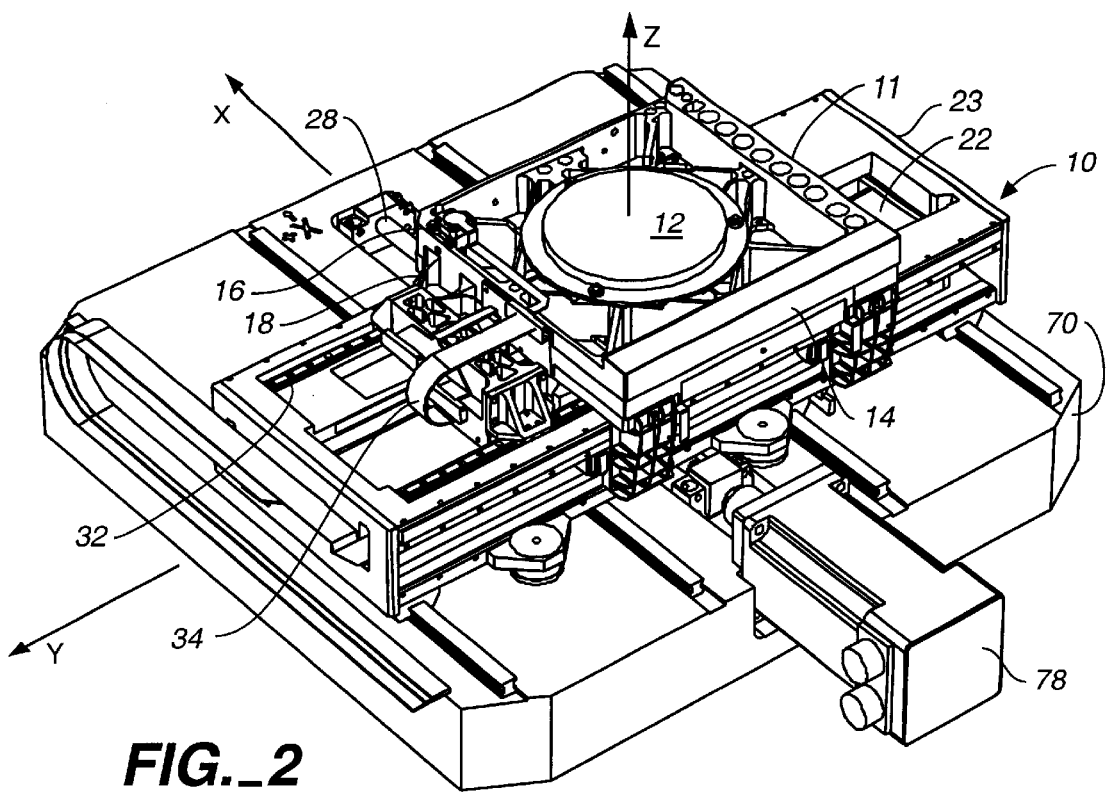
FIG._2

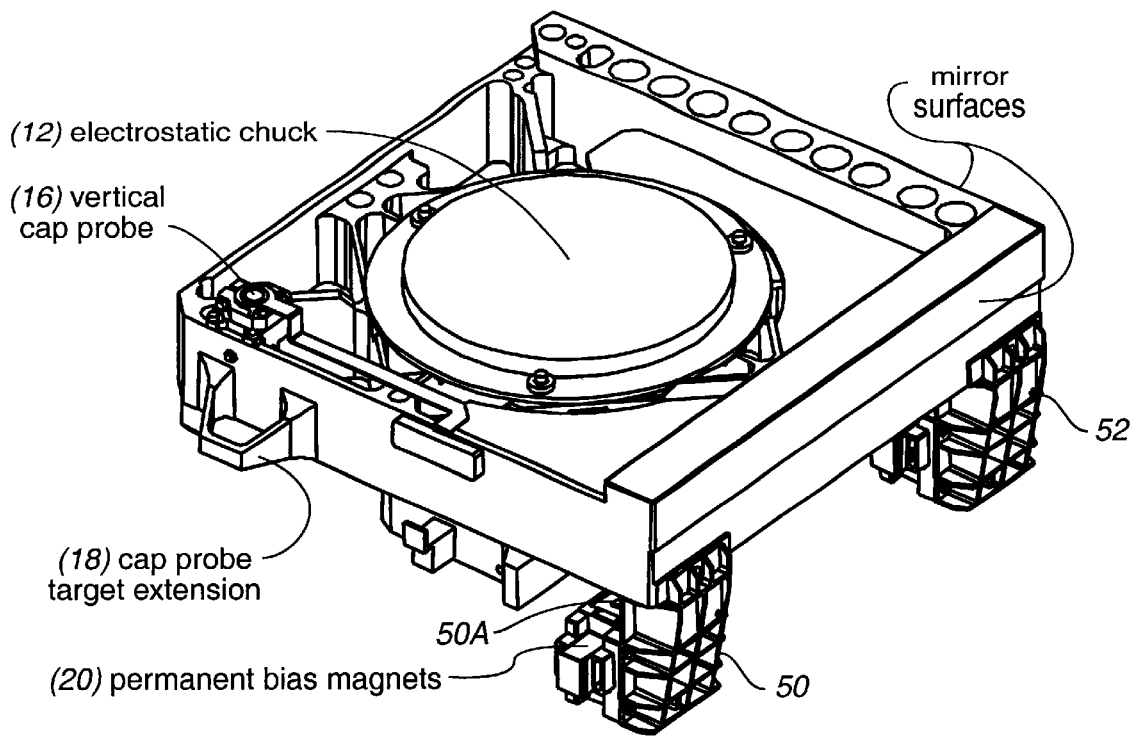
FIG._3
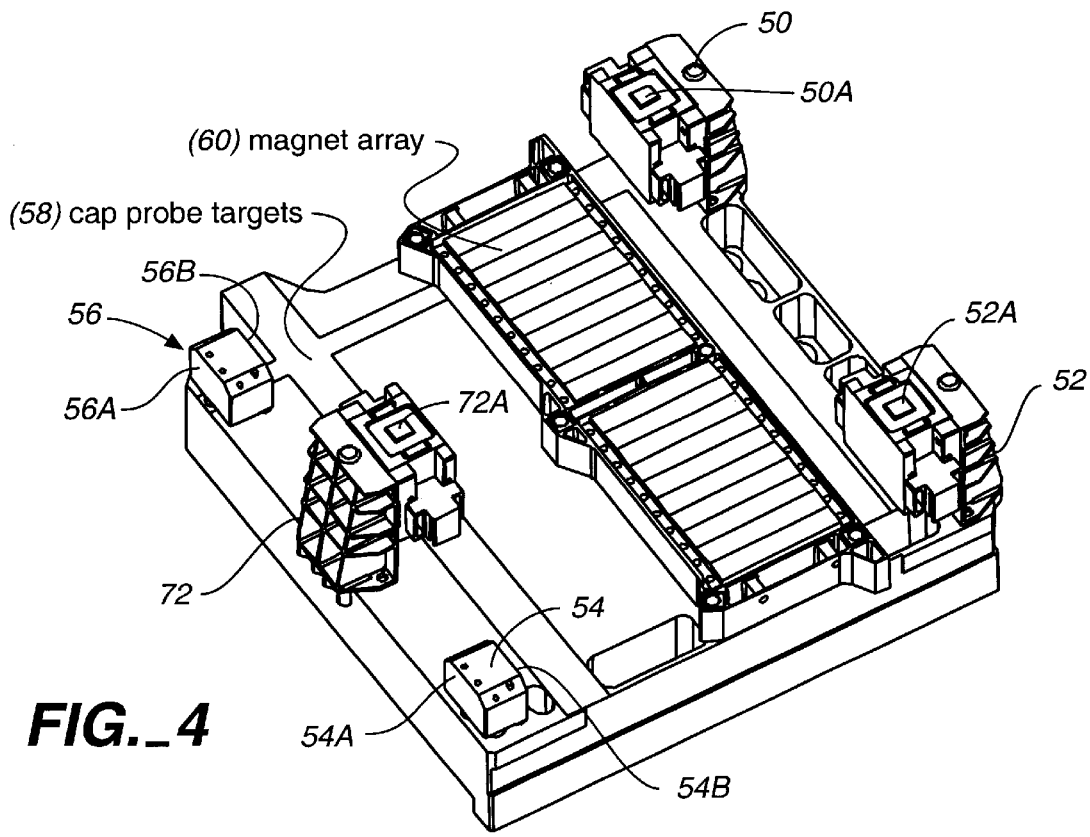
FIG._4

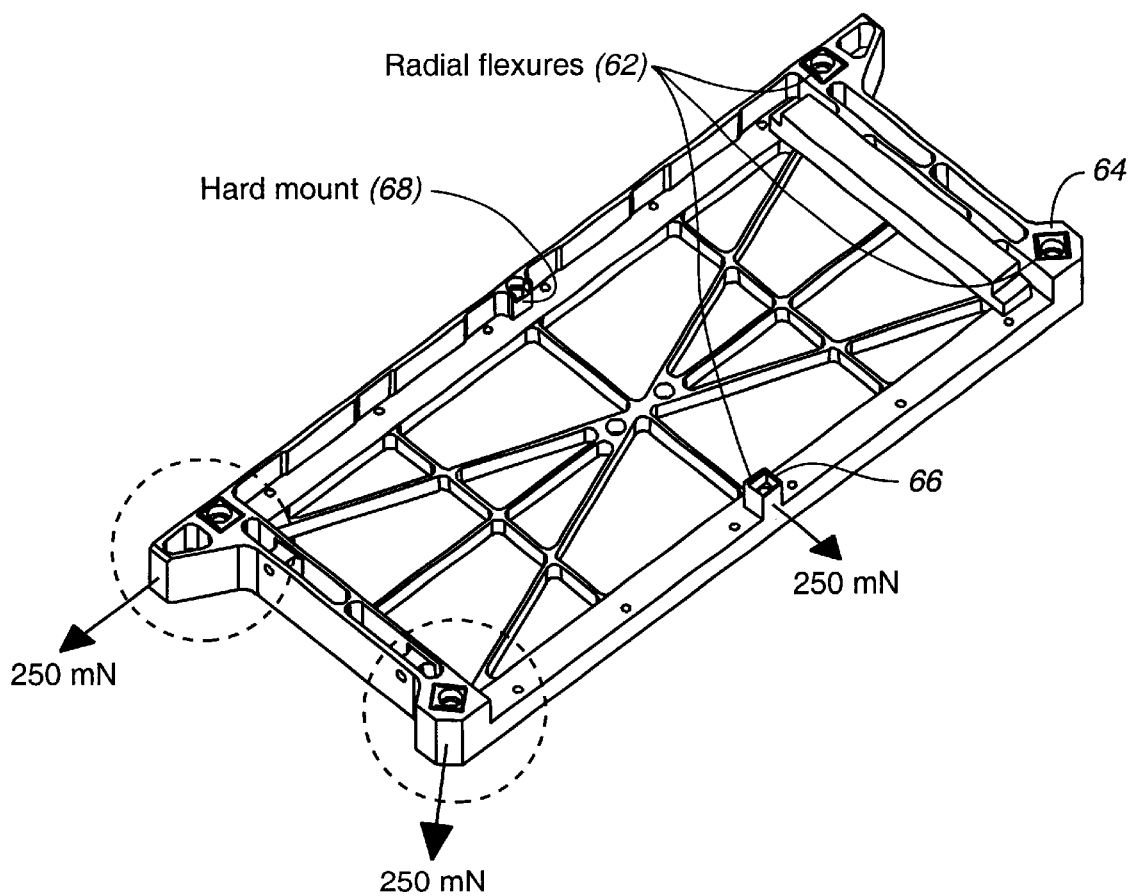
FIG._5
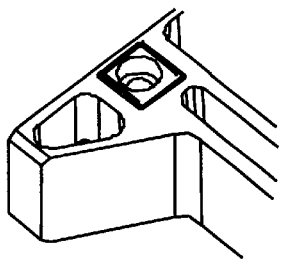
FIG._5A
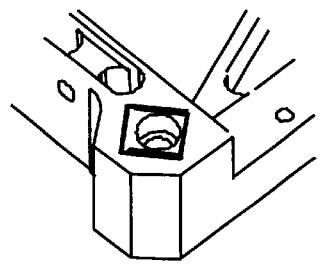
FIG._5B

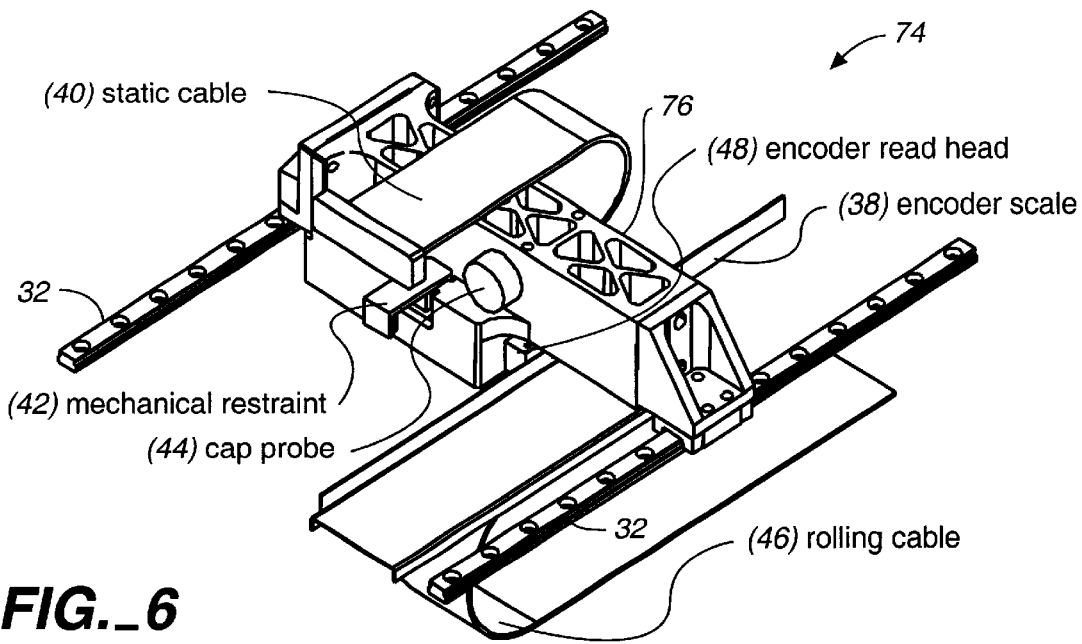
FIG._6
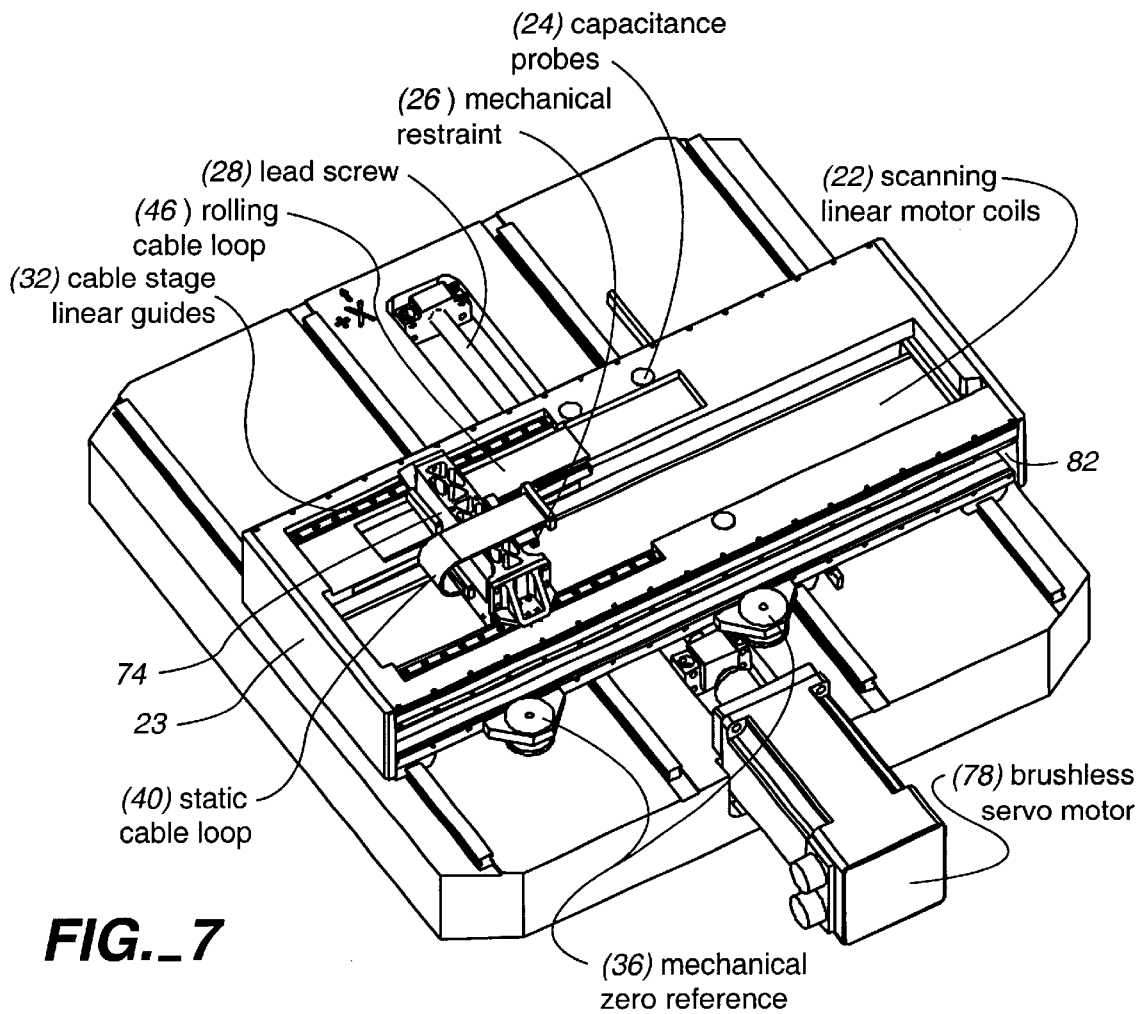
FIG._7

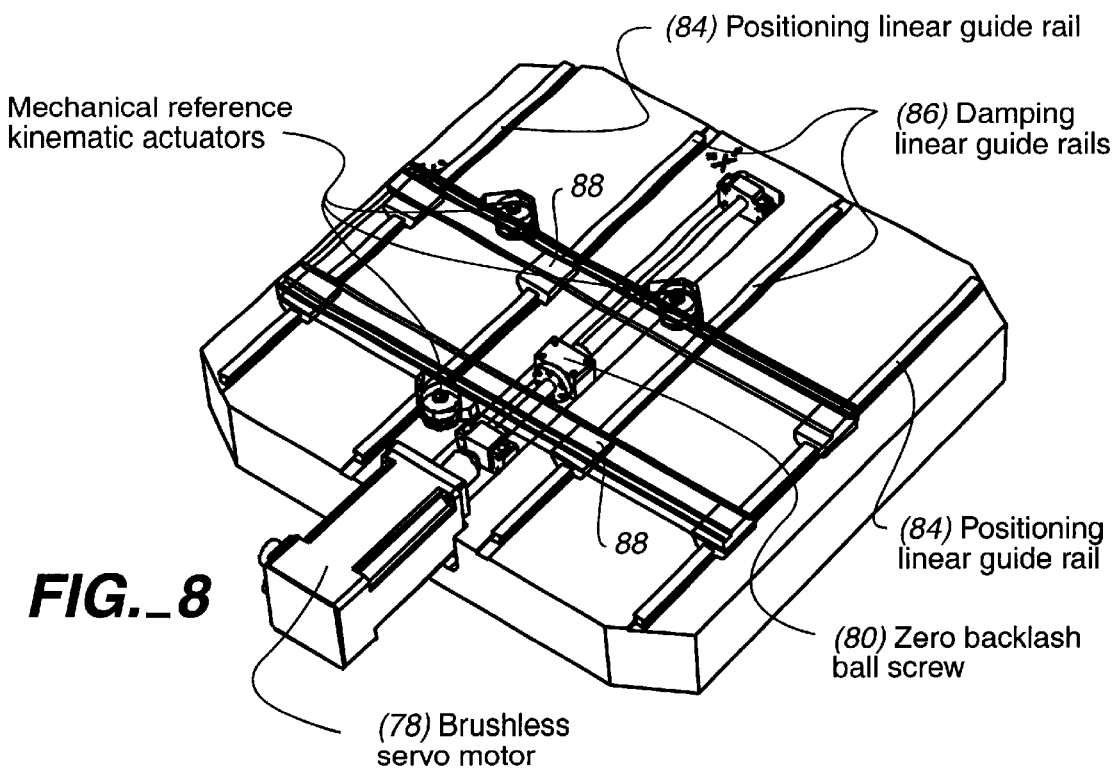
FIG._8
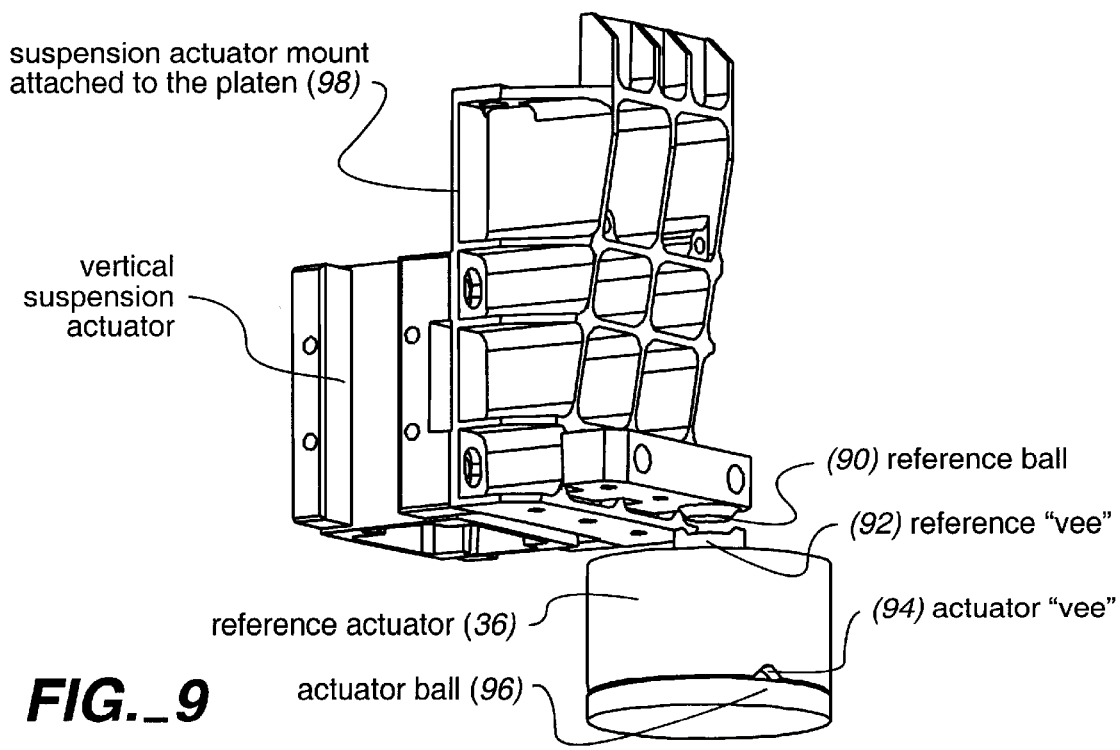
FIG._9

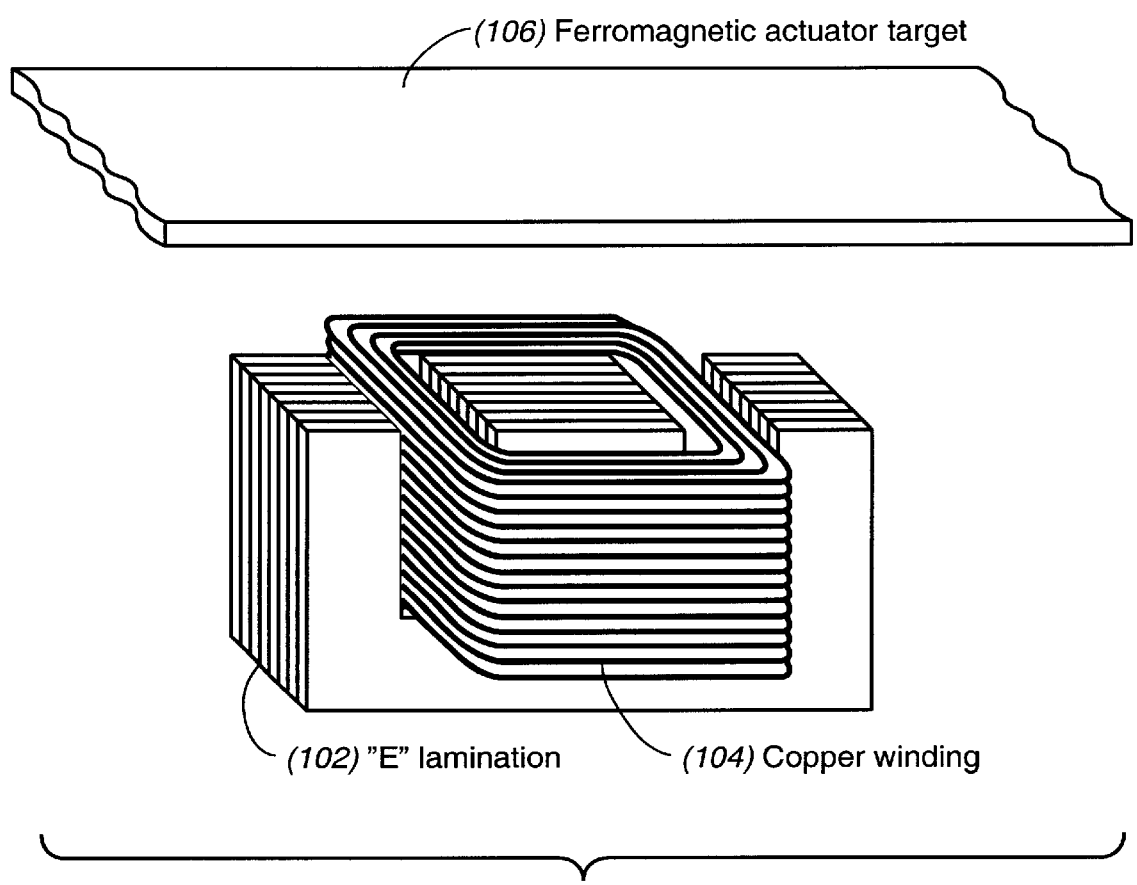
FIG._10

EXTREME-UV SCANNING WAFER AND RETICLE STAGES

This invention was made with Government support under Contract No. DE-AC04-94AL85000 awarded by the U.S. Department of Energy to Sandia Corporation. The Government has certain rights to the invention.

FIELD OF THE INVENTION

This invention relates to an apparatus for positioning an object precisely in three linear and three rotary dimensions, with long travel being provided in two of the linear dimensions. The apparatus is particularly suited for use in extreme-UV projection lithography.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength range of $\lambda$=100 to 200 Å) are now at the forefront of research in efforts to achieve the smaller desired feature sizes. With projection photolithography, a reticle (or mask) is imaged through a reduction-projection lens onto a wafer. Reticles for EUV projection lithography typically comprise a silicon substrate coated with an x-ray reflective material and an optical pattern fabricated from an x-ray absorbing material that is formed on the reflective material. In operation, EUV radiation from the condenser is projected toward the surface of the reticle and radiation is reflected from those areas of the reticle reflective surface which are exposed, i.e., not covered by the x-ray absorbing material. The reflected radiation effectively transcribes the pattern from the reticle to the wafer positioned downstream from the reticle. A scanning exposure device uses simultaneous motion of the reticle and wafer, with each substrate being mounted on a chuck that is attached to an X-Y stage platen, to continuously project a portion of the reticle onto the wafer through a projection optics. Scanning, as opposed to exposure of the entire reticle at once, allows for the projection of reticle patterns that exceed in size that of the image field of the projection lens. Mirrors are mounted along the sides of a stage platen; and interferometer heads that direct laser beams onto the associated mirrors and detect the beam reflection therefrom are employed for position measuring purposes. Movement of the stage platen is accomplished with motorized positioning devices. A stage platen similarly supports the wafer substrate.

Current positioning systems for wafer and reticle stages are composed of bearings and actuators. The types of bearings employed include, for example, sliding contact, rolling elements, air, hydrostatic, flexural, and magnetic. An actuator is a device that provides the accelerating force to move a body relative to another. The types of actuators employed include, for example, motors (linear and rotating), pneumatic, hydraulic, piezoelectric, and electromagnetic (Lorentz and variable reluctance). There are seemingly innumerable bearing and actuator design considerations that affect the performance of a precision machine. Some of the more crucial considerations for a lithography stage are the requirements of acceleration, stiffness, resolution, range of motion, accuracy, repeatability, and thermal performance. Lithography steppers currently produced use a combination of mechanical or air-bearing stages to achieve control of the wafer location in six degrees of freedom. There are various problems associated with these present-day positioning devices.

For mechanical stages with their sliding or rolling bearing elements, positioning errors are caused by friction and the ensuing particulate generation. Moreover, it is difficult to achieve rectilinear motion with flexural stages, this results in coupled degrees of freedom. These systems are also expensive and difficult to manufacture and they usually require electrodischarge machining (EDM), surface grinding, and hand-lapping processes. The resolution is limited by the bearing surface finish. Furthermore, the actuators used for the fine motions (e.g., piezo, voice coil and fluid filled bellows) can be unreliable. Each degree of freedom generally requires an additional layer of mechanical complexity and in some cases must be further subdivided into coarse motions and fine motions. These successive layers result in numerous uncontrolled, underdamped, rigid and elastic body resonant modes which limit allowable stage bandwidth.

With air bearing stages, air bearings are constrained to move in the near vicinity of a plane and thus an additional fine motion stage must be stacked on an air bearing to achieve six degrees of freedom. The fine motion stage must have sufficient travel to overcome any straightness errors present in the air bearing axis. It is difficult to use an air bearing in a vacuum environment; such environments are required in state of the art lithographic systems. In an air bearing, there are up to five uncontrolled degrees of freedom at the wafer. These rigid body modes can limit stage control bandwidth and stage settling times.

The aforementioned problems associated with these conventional stages have limited the ultimate speed and resolution that is attainable. One possible solution to achieve an increase in wafer throughput with a simultaneous improvement in resolution is through the use of a magnetic levitation stage, which is described, for instance, in U.S. Pat. Nos. 5,157,296, 5,196,745, 5,294,854 and 5,699,621.

With magnetic levitation a body is suspended through the interaction of magnetic fields. As it applies to precision motion control, magnetic levitation is used to suspend a rigid body and control its position and attitude in multiple degrees of freedom. Magnetic levitation stages have the unique property that the bearing and actuator functions are combined into a single element. This allows a single rigid body to be positioned and controlled without any mechanical contact. The forces used to perform these functions can be provided by either variable-reluctance or Lorentz force electromagnetic actuators.

A variable-reluctance actuator is a uni-polar forcing device. This means that the reluctance of the magnetic circuit consisting of the electromagnet, the gap, and the ferromagnetic target of the actuator, is minimized by reducing the gap spacing, consistent with external constraints. In other words, the highly permeable ferromagnetic actuator core, driven by a current conducting winding is attracted to a corresponding highly permeable ferromagnetic target. The advantage of this type of actuator is its extremely high force density (N/w). This translates into high servo bandwidths with excellent power efficiency. The disadvantages are that it requires two actuators to provide a bipolar force and the force is a non-linear function of the gap between the core and the target.

A Lorentz force actuator produces bi-polar force through the interaction of a magnetic field produced by current in a coil of wire and the field from a permanent magnet. Reversing the current polarity reverses the direction of the force. A Lorentz force actuator in its simplest form is a voice coil, and in a more complex arrangement is a linear motor. The advantages of linear motors are the extended range of travel over the motor surface, the high acceleration capability, and they are non-contact. The disadvantage is low force density. It requires a very large surface area to provide sufficient control effort with reasonable power dissipation.

The art is in search of improved magnetic levitation precision positioning systems for projection lithography.

SUMMARY OF THE INVENTION

The present invention is directed to a magnetic levitation stage that uses a combination of variable-reluctance and Lorentz force actuators in a power optimal configuration. The configuration presented is designed to provide a small footprint, be power optimal, and provide excellent scanning performance.

In one embodiment, the invention is directed to a stage for precise positioning of a chuck in three orthogonal linear axes and in three orthogonal rotation axes that includes:
 (a) a first subassembly that includes:
  (i) a monolithic mirror that supports the chuck wherein the monolithic mirror has at least two polished orthogonal faces for interferometric determination of the X, Y, and Θz positions;
  (ii) a plurality of electromagnetic actuators that control fine positioning in all six axes and coarse positioning in one axis;
  (iii) a position sensor for measuring the vertical Z position of the monolithic mirror; and
  (iv) a Lorentz actuator, that includes magnet array, for effecting motion in the Y axis; and
 (b) a second subassembly that includes a stepping axis beam over which the first subassembly is suspended, wherein the stepping axis beam includes a drive coil array for the Lorentz actuator.

In the preferred embodiment, the second subassembly further includes a cable stage subassembly that is positioned a fixed distance away from the monolithic mirror.

In another preferred embodiment, the stage further includes a mechanical zero reference for the first subassembly.

In yet another preferred embodiment, the stage also includes a linear motor with independently controlled coils to enable independent control of the motion of the first and second subassemblies wherein each of the first and second subassemblies includes respective first and second magnetic arrays.

In another embodiment, the invention is directed to a stage comprising an actuator that includes a magnetic array that is mounted on a strain reducing flexure mount.

BRIEF DESCRIPTION OF THE DRAWINGS

FIG. 1 is a schematic of the main elements of an exemplary photolithogaphy apparatus;

FIG. 2 is a perspective view of the magnetic levitation wafer stage assembly;

FIG. 3 is a perspective view of the magnetic levitation suspended platen;

FIG. 4 is the underside view of the magnetic levitation suspended platen;

FIGS. 5, 5A and 5B are perspective views of the magnet array flexure mount;

FIG. 6 is a perspective view of the cable stage assembly;

FIG. 7 illustrates the stepping axis (X) beam;

FIG. 8 illustrates the leadscrew components;

FIG. 9 illustrates the mechanical reference actuator; and

FIG. 10 illustrates an "E" shaped lamination type electromagnet.

DETAILED DESCRIPTION OF THE INVENTION

The present invention is particularly applicable to the wafer and reticle stages for EUV scanning lithography. FIG. 1 schematically depicts an exemplary apparatus for EUV lithography that comprises a radiation source 141, such as a synchrotron or a laser plasma source, that emits x-rays 142 into condenser 143 which in turn emits beam 144 that illuminates a portion of reticle or mask 145. The emerging patterned beam is introduced into the imaging optics 146 which projects an image of mask 145, shown mounted on mask stage platen assembly 147, onto wafer 148 which is mounted on wafer stage platen assembly 149. The stage platen assemblies 147 and 149 comprise a stage platen and associated components for its maneuver. Precision movement of stage platen assemblies can be implemented by magnetic levitation mechanisms described herein.

In a preferred embodiment, the stage platen assemblies 147 and 149 are housed in separate chambers that are separated from the other elements of the photolithography system located upstream as illustrated in FIG. 1. Stage platen assembly 147 supporting mask 145 is housed in the mask chamber or zone 151 which is typically maintained at sub-atmospheric pressure preferably between 1 mTorr to 100 mTorr. Similarly, stage platen assembly 149 supporting wafer 148 is housed in wafer chamber or zone 152 which is preferably maintained at a pressure below about 100 mTorr. Chamber 152 includes a window 154 that is made of a suitable material that transmits EUV. The other elements can be housed in one or more chambers which are preferably maintained in vacuum to minimize attenuation of the x-rays. EUV radiation projected from the mask and translated by a camera travels through an aperture in the wafer chamber. The individual elements that form the EUV lithography device as shown in FIG. 1 can comprise conventional optical devices, e.g., condensers, cameras, and lens, for projection EUV lithography. Preferably the EUVL device employs a condenser that collects soft x-rays for illuminating a ring-field camera.

As illustrated in FIG. 1, the upper surface of mask 145 is facing the upper surface of the wafer 152. In one embodiment, the reticle is inverted so that gravity pulls the wafer from the chuck. A higher clamping force, e.g., electrostatic charge, will be needed to account for the gravitational force. Preferably, the chuck is an electrostatic chuck (ESC) because this design combines the advantages of the more uniform clamping ability of vacuum chucks and the usability in vacuum environments of mechanical chucks. In an ESC, a voltage difference is applied between the substrate (e.g, reticle or wafer) and a metallic electrode or pair of electrodes that is embedded in an insulator block, the substrate and electrode(s) being separated by an interposed dielectric layer. ESC devices are known in the art and are described, for example, in U.S. Pat. Nos 5,221,403, 5,835,333 and 5,835,334 which are incorporated herein by reference.

Wafer and reticle stages are functionally identical with minor differences in the mounting and the inclusion of a linear guide axis for the wafer stage. Shown in FIG. 2 is an embodiment of the magnetic levitation/linear guide wafer stage assembly. In one embodiment, the reticle stage is identical in geometry and layout without the stepping X axis and with minor changes made to the beam and mounting configuration. Preferably, the magnetic levitation portion of the stage has a travel range of 400 $\mu$m in the X and Z directions, 225 mm in Y and 1 milliradian of $\Theta_x$ $\Theta_y$ $\Theta_z$ rotation.

Referring to FIG. 2, magnetic levitation stage assembly 10 which is constructed on base 70 includes a first subassembly for moving the electrostatic chuck 12, which is supported by platen 11, in the y direction on the stepping axis beam of the second subassembly. The second subassembly includes a stepping axis beam 23, a motor, for example, a brushless servo motor 78 and a leadscrew 28 for moving the first assembly in the x direction.

FIGS. 3 and 4 illustrate top and bottom views, respectively, of a first sub assembly. As shown, a semiconductor wafer or reticle can be mounted on the electrostatic chuck 12 which is secured to a suspended carrier henceforth referred to as the platen 11, which is typically configured as a generally rectangular construction. Preferably at least two outer surfaces 14 of the platen subassembly are polished to function as mirrors for interferometric positioning devices in the X and Y directions. A position sensor, such as a vertical capacitance probe 16 is used to sense the Z-axis position of the platen with respect to an external reference surface above the platen in order to decouple position information from an array of capacitance gauges that are used to provide force linearizing information. It is secured on an upper surface of the platen. Capacitance probe target 58 and capacitance probe target extension 18 are used with the capacitance gauge array on the stepping axis beam to provide force linearizing information for ten electromagnetic actuators in the actuator assemblies 50, 52, and 72. Each vertical actuator assembly 50, 52, and 72 includes permanent bias magnets 20.

Referring to FIG. 4, it is shown that magnet array 60 and horizontal actuators assemblies 54 and 56 are secured to the lower surface of the platen subassembly. The magnet array 60 is mounted on a flexure mount which is illustrated in FIG. 5. The flexure mount is designed to minimize differential thermal strains between the magnet array and the mirror.

FIGS. 7 and 8 show that the second subassembly, including the scanning linear motor coils 22 that drives the suspended platen subassembly and the cable stage assembly (FIG. 6) along the Y-axis. The second subassembly further includes capacitance probes 24, mechanical restraint 26, leadscrew 28, rolling cable loop 46, mechanical zero references 36 and a cable stage subassembly 74. The cable stage subassembly 74 has a support member 76 that is mounted on cable stage linear guides 32. The cable stage assembly further includes a static cable 40, mechanical constraint 42, a capacitance probe 44, and rolling cable 46, encoder read head 48 and encoder scale 38.

Movement of the stepping axis beam 23 in the X-axis is achieved by activating a servo motor 78 which turns leadscrew 28. The leadscrew drives a zero backlash ball nut 80 (FIG. 8), attached to the underside of the stepping axis beam 23.

Actuator Placement

The six degrees of freedom magnetic suspension scanning axis consists of ten variable reluctance actuators and a single degree of freedom linear motor. The ten variable reluctance actuators (five bi-polar pairs) control five degrees of freedom (X, Z, $\Theta_x$, $\Theta_y$, $\Theta z$) and the linear motor controls the long travel (Y) scanning degree of freedom. Shown in FIG. 3 and FIG. 4 is the suspended wafer carrier portion of the stage, the platen. The platen carries the variable-reluctance actuators and the magnet array of the linear motor. Shown in FIG. 7 is a stepping axis beam 23 that contains the ferromagnetic targets 82 that complete the magnetic circuit of the variable-reluctance actuators. These targets are located above and below the actuators and are align along the Y-axis.

The six vertical actuator assemblies 50,52,72, are arranged in three bi-polar pairs at the vertices of a triangle (FIG. 4). Each vertical actuator assembly includes 2 actuators (50A and 50B, 52A and 52B, and 72A and 72B) that are oppositely oriented and aligned with its vertical axis. Along with the corresponding ferromagnetic targets, they provide kinematic control forces in three degrees of freedom (Z, $\Theta_x$, $\Theta_y$). The vertical actuators are arranged such that the platen center of gravity is coaxial with the vertical center of force of the three actuator pairs. As arranged, the actuators will each exert one third of the vertical control effort and can be identically sized. Additionally, gravity off-setting permanent bias magnets 20 attached to each of the actuator housings are sized the same and support an equal share of the gravitational load. These passive permanent bias magnets reduce the power dissipation requirement of the active electromagnets of the vertical actuators by nulling out the weight of the platen.

The four horizontal actuators (FIG. 4) are arranged in two bi-polar pairs 54, 56, at two adjacent corners of the platen and provide X and $\Theta_z$ control. The bipolar pairs are oriented so that the force axis is parallel to the X axis. The location of the horizontal actuators provides several benefits. First, it places the horizontal line of force close to the platen center of gravity which is located nearly at the bottom surface of the platen. This reduces the mechanical coupling between the X and $\Theta_y$ degrees of freedom. Reduced coupling results in higher bandwidths and lower power dissipation due to the smaller control effort. Second, it reduces the radius of gyration around the X and Y axes resulting in lower principal moments of inertia $I_{xx}$ and $I_{yy}$. Lower moments of inertia also result in less control effort.

Electric current to the variable-reluctance actuator coils, as well as to the ESC and a vertical capacitance probe 16, is conducted through plastic (e.g., KAPTON) flex cables 34, 46, that have well defined single degree of freedom rolling paths.

Since the variable reluctance force is highly non-linear, five gap measuring capacitance gauges 24 are located on the linear guide stage beam to provide force linearizing information. The capacitance gauges are located on the beam to reduce the number of connections that must be made to the suspended platen. The capacitance gauges are preferably constructed from flex cable configured to roll in a very repeatable manner. The capacitance gauge targets 58 consist of a layer of enhanced aluminum deposited on the bottom side of the platen. In addition to the five position probes, a vertical probe located on the moving stage and acting in conjunction with an external stationary reference target above the platen provides decoupling position information.

Platen Design

Typical precision machine design techniques dictate that for best accuracy the force and metrology loops should be separate so that control forces do not distort the feedback measurement. This separation of loops is typically accomplished by kinematically mounting a separate mirror on the stage structure. This technique, if properly implemented, ensures that the forces seen by the mirror are kinematically constrained and the mirror should remain dimensionally stable.

In the EUVL stage implementation, force and metrology loops are combined into a single monolithic structure. Despite being counter to conventional design practice, this geometry will work due to the unique nature of the applied magnetic levitation control forces. Since magnetic levitation is non-contact, the platen will not be rigidly constrained and the applied control forces are kinematic as described in the following text. This design has the advantage of being lighter and thus reduces power requirements for position control and higher control bandwidth.

The platen mirror has the active components (actuators, motor magnet array) mounted to it. The mirror is preferably fabricated from a low coefficient of thermal expansion material such as glass ceramic that is commercially available as ZERODUR from Schott Janaer Glas, GmbH, Mainz, Germany. The design intent is to reduce the suspended mass by using the mirror as a structural element. This is possible if the control forces are kinematic and do not work to distort the mirror shape. Both reduced mass and higher elastic modes will enable higher control bandwidths which reduce settling times and increase dynamic stiffness. In addition to avoiding over-constraining control forces, it is necessary that care be taken in attaching the individual parts to the mirror. For example, the linear motor magnet array is only rigidly bolted at a single location as seen in FIGS. 5, 5A and 5B. The remaining five attachment points are made through single degree of freedom flexures that are compliant in the direction of greatest thermal growth and very stiff in the perpendicular direction. In the preferred embodiment being described for example, a force of 250 mN in a radial direction from the rigidly attached location will cause bending of the flexures. This single degree of freedom flexure reduces the strain placed on the mirror by differential thermal growth between the mirror and magnet array. Also, thermal distortion of the mirror from actuator power dissipation is a concern. To reduce this power, the actuators are optimized for size and power and the total suspended mass of the stage is minimized. Through finite element simulations it was determined that the greatest thermal distortion in the mirror is six nanometers with the average distortion much less. Since the mirror is polished flat to approximately 30 nm, the thermal distortion is within practical limits.

To provide a gravity offsetting DC bias force, permanent magnets 20 are mounted on each side of the three actuator housings. As shown in FIGS. 3 and 4, these permanent magnets are located as close as possible to the location of the vertical control forces. This is done to retain the kinematic placement of the control and bias forces. The operating gap for the permanent magnets is designed to be approximately 1 cm. With a large magnet air gap the lifting force will be less sensitive to small changes in the platen vertical position thus reducing the potential for disturbance forces.

A preferred electromagnet for use in the actuators is illustrated in FIG. 10 and it comprises an "E" shaped nickel-iron (or other high permeability, low hysteresis alloy) lamination 102 with copper windings 104 around the center leg of the "E". The individual plates of the "E" shaped lamination are electrically insulated to eliminate eddy currents. The magnetic circuit is between the center leg and the outer legs of the "E" laminations through the ferromagnetic actuator target 106.

Cable Stage

Rejecting disturbance forces while scanning is much more difficult than during step-and-repeat operations. During a scan, the deviation from the desired position due to an external force is directly dependent on the velocity and the time between position samples (sampling interval). As the velocity increases, the excursions from the nominal also increase for a given disturbance force. Therefore, for a desired position tracking error, the magnitude of the disturbance force must be reduced as the velocity is increased. A cable stage is an excellent method of reducing the coupling of the scanning stage to any source of disturbance forces transmitted through the machine base and from non-repeatable rolling cables.

Included in the stage design is a cable stage that is designed to reduce the disturbance forces imparted on the scanning stage by rolling cables (FIGS. 6 and 7). The cable stage bearings are small linear guides and are actuated in the scanning direction by a permanent magnet linear motor which utilizes the wafer stage motor coils 22. The cable stage follows the wafer stage and is commutated similar to the scanning linear motor. The cable stage is coupled to the wafer stage through a very compliant static cable loop. During wafer stage motion, the relative position between the wafer stage and the cable stage should not change significantly and any disturbance force generated and transmitted through the static cable loop will be low frequency and within the suspension control bandwidth. A rolling cable loop from the lower axis (Y) to the cable stage rolls under the cable stage in a channel parallel to the linear motor coils. The cable stage position is determined with an optical linear encoder. Other positioning sensing devices, including, for example, interferometric sensors and magnetic sensors can also be employed. A capacitance probe located on the cable stage is added to determine the relative position between the cable stage and the wafer/reticle stage. The linear motor that controls the cable stage position is described in the following section.

Linear Motor

The long scanning axis (Y) position control is achieved with a Lorentz type planar linear motor. The motor is sized to dissipate no more than 1 watt during a 0.1 g acceleration of a 10.5 kg mass. While the motor is sized for the required acceleration and power dissipation, it has the force capacity to accelerate the stage in excess of 1 g. As stated, the magnet array of the motor is carried by the platen and the current carrying coils are carried by the stepping axis beam 23 as seen in FIG. 7. In addition to providing Y control of the platen, the linear motor also controls the position of the cable stage. This means that two independent motions are controlled with the same linear motor coils. This is accomplished by maintaining individual current control of the coils of wire that reside in the area that is used by both the wafer stage and the cable stage. In standard moving magnet linear motors, the coils in the entire coil array is energized and commutated in a fixed phase relationship despite the fact that the magnet array only covers a portion of the coil. In this EUVL motor application, only the coils directly under the current position of the magnet array 60 are energized. This allows the remaining coils not directly under the platen magnet array to be utilized to position the cable stage in the same fashion as the wafer stage. The cable stage has its own magnet array. This is particularly useful in a vacuum where mechanical contact actuators leadscrews, belt drives, band drives, etc.) are undesirable. In addition to being a non-contact actuator, it packages well with the scanning stage and does not require any further in-the-vacuum hardware. The additional control burden is off-loaded to amplifiers and control electronics that are located outside the chamber. This motor configuration solves several problems. First, it is non-contact, thus would normally have zero particulate generation. Second, no additional hardware is required, and third, the power dissipated is not increased by adding this capability. These motor solution advantages would apply equally as well for a non-vacuum system.

Stepping (X) Axis

As seen in FIG. 6, the magnetic levitation stage is then transported in the perpendicular direction (X) by a high stiffness well damped linear guide leadscrew driven stage. It is not necessary for the lower stage to achieve maximum resolution since the magnetic levitation stage has redundant degrees of freedom in the X direction which eliminates the positioning dependence on the bearing surface finish. In fact, the resolution limiting friction present in the linear guides should provide some very desirable coulomb damping. Linear guides also have high stiffness torsionally and laterally, which provides a very stable base for the magnetic levitation stage both in a step and repeat and a scanning mode of operation. The outer two parallel linear guide rails 84 are used to position the stage and the inner two parallel linear guide rails 86 are used for increased broad band damping of the elastic modes of the stage beam. These inner linear guide blocks 88 are mounted to the beam through an elastomer that should provide multi-degree of freedom damping.

A preloaded leadscrew, which reduces backlash, is used to drive stepping axis beam 23 through a zero backlash ball screw 80 attached to the underside of the beam. The leadscrew is chosen for the lower power dissipation provided by the mechanical advantage. Since the velocity requirements of this stage are low, the high speed and high acceleration advantages of a direct drive linear motor are not required. Also, by using a leadscrew the motor power is dissipated away from the stage. The leadscrew is driven by a brushless servo motor 78.

Mechanical Reference

Since this stage is designed to be used in a vacuum chamber and access to it is limited, a method of mechanically positioning the platen at the nominal zero position is necessary. To accomplish this, a set of three vertically actuated ball and v-groove zero position reference mounts is utilized (FIG. 9). In operation, these mounts would move vertically to position a reference v-groove 92 under a reference ball 90 mounted to each of the vertical actuator housings on the suspended platen. The three mounts together form a kinematic support that should be repeatable to within a micron. In addition to the platen kinematic mount, each of the vertically actuated mounts must also be repeatable. Since there will necessarily be play in the actuator v-groove in order for the actuator to move, the actuator reference v-groove will require a fixed and repeatable position reference when engaged. This is accomplished with an additional three ball and v-groove mounts on the opposite end of each of the three actuators. When an actuator is activated, the set of three ball 96 and v-groove 94 contacts on the bottom side of the actuator will engage, fixing the position of the reference v-groove 92. Engaging the three reference v-grooves 92 to the three reference balls 90 attached to the three suspension actuator mounts 98 creates a repeatable zero position with respect to the scanning axis beam 23 for the platen 11. This system is especially useful when access to the magnetic levitation stage is limited. It is usually not required on a stage system designed to operate in a normal atmosphere environment.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A stage for precise positioning of a chuck in three orthogonal linear axes and in three orthogonal rotation axes that comprises:
   (a) a first subassembly comprising:
      (i) a monolithic mirror that supports the chuck wherein the monolithic mirror has at least two polished orthogonal faces for interferometric determination of the X, Y, and $\Theta z$ positions;
      (ii) a plurality of electromagnetic actuators that control fine positioning in all six axes and coarse positioning in one axis;
      (iii) a position sensor for measuring the vertical Z position of the monolithic mirror; and
      (iv) a Lorentz actuator, that includes a magnet array, for effecting motion in the Y axis wherein the magnet array is mounted on a strain reducing flexure mount that has a single rigid attachment location and a plurality of flexible attachment locations; and
   (b) a second subassembly comprising a stepping axis beam over which the first subassembly is suspended, wherein the stepping axis beam includes a drive coil array for the Lorentz actuator, wherein the second subassembly further comprises a cable stage subassembly.

2. The stage of claim 1 wherein the cable stage subassembly is not in contact with the monolithic mirror and cable stage subassembly can move independently of monolithic mirror.

3. The stage of claim 2 wherein the cable stage subassembly is positioned a fixed distance away from the monolithic mirror.

4. The stage of claim 1 further comprising a mechanical zero reference for the first subassembly.

5. The stage of claim 4 comprising a linear motor with independently controlled coils to enable independent control of the motion of the first and second subassemblies wherein each of the first and second subassemblies includes respective first and second magnetic arrays.

6. The stage of claim 4 wherein the mechanical zero reference comprises three ball and corresponding v-groove contacts, wherein the v-grooves are driven by zero position reference actuators into mating balls that are slideably positioned on suspension actuator mounts and the position of each v-groove is fixed by a second set of three ball and corresponding v-groove contacts that are located on the opposite end of each of the zero position reference actuators.

7. The stage of claim 1 further comprises at least one gap probe.

8. The stage of claim 7 wherein each gap probe is a capacitance gap probe.

9. The stage of claim 1 further comprising a brushless servo motor that moves the stepping axis beam in the X axis.

10. The stage of claim 9 wherein the brushless servo motor drives a leadscrew that engages and moves the stepping axis beam through a zero backlash ball screw in the X axis.

11. The stage of claim 1 comprising a linear motor with independently controlled coils to enable independent control of the motion of the first and second subassemblies wherein each of the first and second subassemblies includes respective first and second magnetic arrays.

12. The stage of claim 1 wherein the strain reducing flexure mount has five flexible attachment locations.

13. A stage for precise positioning of a chuck in three orthogonal linear axes and in three orthogonal rotation axes that comprises:
   (a) a first subassembly comprising:
      (i) a monolithic mirror that supports the chuck wherein the monolithic mirror has at least two polished orthogonal faces for interferometric determination of the X, Y, and $\Theta z$ positions;
      (ii) a plurality of electromagnetic actuators that control fine positioning in all six axes and coarse positioning in one axis;
      (iii) a position sensor for measuring the vertical Z position of the monolithic mirror; and
      (iv) a Lorentz actuator, that includes magnet array, for effecting motion in the Y axis;
   (b) a second subassembly comprising a stepping axis beam over which the first subassembly is suspended, wherein the stepping axis beam includes a drive coil array for the Lorentz actuator; and
   (c) a mechanical zero reference to position the first subassembly at a nominal zero position.

14. The stage of claim 13 wherein the mechanical zero reference comprises three ball and corresponding v-groove contacts, wherein the v-grooves are driven by zero position reference actuators into mating balls that are slideably positioned on suspension actuator mounts and the position of each v-groove is fixed by a second set of three ball and corresponding v-groove contacts that are located on the opposite end of each of the zero position reference actuators.

15. A stage for precise positioning of a chuck in three orthogonal linear axes and in three orthogonal rotation axes that comprises:
   (a) a first subassembly comprising:
      (i) a monolithic mirror that supports the chuck wherein the monolithic mirror has at least two polished orthogonal faces for interferometric determination of the X, Y, and $\Theta z$ positions;
      (ii) a plurality of electromagnetic actuators that control fine positioning in all six axes and coarse positioning in one axis;
      (iii) a position sensor for measuring the vertical Z position of the monolithic mirror; and
      (iv) a Lorentz actuator, that includes a magnet array, for effecting motion in the Y axis wherein the magnet array is mounted on a strain reducing flexure mount that has a single rigid attachment location and a plurality of flexible attachment locations;
   (b) a second subassembly comprising a stepping axis beam over which the first subassembly is suspended, wherein the stepping axis beam includes a drive coil array for the Lorentz actuator; and
   (c) a linear motor with independently controlled coils to enable independent control of the motion of the first and second subassemblies, wherein each of the first and second subassemblies includes respective first and second magnetic arrays.

16. The stage of claim 15 wherein the flexure mount has five flexible attachment locations.

* * * * *